US011724962B2

United States Patent
Luo et al.

(10) Patent No.: US 11,724,962 B2
(45) Date of Patent: Aug. 15, 2023

(54) METHOD FOR ETCHING CURVED SUBSTRATE (71) Applicant: The Institute of Optics and Electronics, The Chinese Academy of Sciences, Sichuan (CN)

(72) Inventors: Xiangang Luo, Sichuan (CN); Xiong Li, Sichuan (CN); Mingbo Pu, Sichuan (CN); Xiaoliang Ma, Sichuan (CN); Kaipeng Liu, Sichuan (CN); Zeyu Zhao, Sichuan (CN)

(73) Assignee: The Institute of Optics and Electronics, The Chinese Academy of Sciences, Chengdu (CN)

( * ) Notice: Subject to any disclaimer, the term of this patent is extended or adjusted under 35 U.S.C. 154(b) by 0 days.

(21) Appl. No.: 17/997,505

(22) PCT Filed: Apr. 28, 2021

(86) PCT No.: PCT/CN2021/090692
§ 371 (c)(1),
(2) Date: Oct. 28, 2022

(87) PCT Pub. No.: WO2021/219032
PCT Pub. Date: Nov. 4, 2021

(65) Prior Publication Data
US 2023/0174416 A1 Jun. 8, 2023

(30) Foreign Application Priority Data
Apr. 29, 2020 (CN) .......................... 202010354561.7

(51) Int. Cl.
*C03C 15/00* (2006.01)
*G03F 7/00* (2006.01)
(Continued)

(52) U.S. Cl.
CPC ............ *C03C 15/00* (2013.01); *G03F 7/2043* (2013.01); *H01J 37/32568* (2013.01); *H01J 2237/24585* (2013.01); *H01J 2237/3341* (2013.01)

(58) Field of Classification Search
None
See application file for complete search history.

(56) References Cited

U.S. PATENT DOCUMENTS

| 2003/0235362 A1* | 12/2003 | Sugama ................... G02F 1/313 385/16 |
| 2009/0212026 A1* | 8/2009 | Sato ......................... B23H 9/00 219/69.12 |
| 2018/0154556 A1* | 6/2018 | Yamamoto .......... B29C 33/3842 |

FOREIGN PATENT DOCUMENTS

| CN | 101924173 A | 12/2010 |
| CN | 103000769 A | 3/2013 |

(Continued)

OTHER PUBLICATIONS

"International Application Serial No. PCT/CN2021/090692, International Search Report dated Jul. 30, 2021", w/English Translation, (Jul. 30, 2021), 10 pgs.

(Continued)

*Primary Examiner* — Shamim Ahmed
(74) *Attorney, Agent, or Firm* — Schwegman Lundberg & Woessner, P.A.

(57) ABSTRACT

A method for etching a curved substrate is provided, including: forming a conductive thin film layer with an etched pattern on the curved substrate; supplying power to the conductive thin film layer such that the conductive thin film layer has an equal potential at each position of the conductive thin film layer; etching each position of the curved substrate to an etching depth corresponding to the potential at each position of the conductive thin film layer based on (Continued)

the etched pattern of the conductive thin film layer, so as to obtain the curved substrate having a consistent etching depth at each position of the curved substrate. With the etching method, it is possible to etch an arbitrary curved surface to obtain a microstructure with a uniform processing depth.

19 Claims, 6 Drawing Sheets

(51) Int. Cl.
　　*G03F 7/20*　　　(2006.01)
　　*H01J 37/32*　　　(2006.01)

(56) References Cited

FOREIGN PATENT DOCUMENTS

| | | |
|---|---|---|
| CN | 111517274 A | 8/2020 |
| JP | 03253802 A | 11/1991 |
| WO | WO-2021219032 A1 | 11/2021 |

OTHER PUBLICATIONS

"International Application Serial No. PCT/CN2021/090692, Written Opinion dated Jul. 30, 2021", w/ English Translation, (Jul. 30, 2021), 8 pgs.

* cited by examiner

METHOD FOR ETCHING CURVED SUBSTRATE

CROSS-REFERENCE TO RELAYED APPLICATION

This application is a U.S. national stage filing under 35 U.S.C. § 371 from International Application No. PCT/CN2021/090692, filed on 28 Apr. 2021, and published as WO2021/219032 on 4 Nov. 2021, which claims priority under 35 U.S.C. 119 to Chinese Patent Application No. 202010354561.7, filed on Apr. 29, 2020, the benefit of priority of each of which is claimed herein, and which applications and publication are hereby incorporated herein by reference in their entirety.

TECHNICAL FIELD

The present disclosure relates to a field of micro-nano manufacturing technology, and in particular to a method for etching a curved substrate.

BACKGROUND

A diffractive optical element, such as a Fresnel lens, a diffraction grating, and a holographic grating, mainly employs a diffraction microstructure on a surface of the element to modulate phase, amplitude, polarization, and the like of a light wave, so as to realize special functions such as beam smoothing, focusing, collimating, beam splitting, beam combining, and the like. Compared with a traditional optical element, a diffractive optical system has characteristics such as high integration, multiple functions, small size, and light weight. Limited by insufficient processing capability, most of the current diffractive optical elements employ a flat substrate, whereas a diffractive optical element with a curved substrate is generally processed in an infrared band which can meet requirements of low processing accuracy. For an optical waveband curved diffraction element, a diffraction micro-nano structure with a feature size at a micrometer level is required to be processed on an arbitrary non-rotationally symmetric curved substrate, and a processing accuracy of a depth of the entire curved microstructure is required to be controlled within a few tens of nanometers. It is difficult for traditional microstructure processing methods, such as a turning method using diamond lathes, to meet the above processing requirements.

At present, in order to process an optical waveband diffraction microstructure on a curved substrate, it is firstly required to process a patterned microstructure with high precision on a photoresist layer on the curved substrate by using a beam direct writing method. Then, by using a reactive ion etching (RIE) method, a patterned microstructure of the photoresist layer is transferred to an optical material substrate, such as a quartz or silicon substrate. In a traditional RIE equipment, a sample stage (i.e., a lower electrode) for placing a sample is always in a form of a flat plate, so that it is difficult to transfer a patterned microstructure on a curved substrate by etching. The reason is that microstructures on a curved surface being at different heights from the flat electrode may lead to different electric field strengths, and this may further lead to different etching rates, so that it is difficult to uniformly etch diffraction microstructures of the entire curved surface in nanometer level with high precision. On this basis, how to achieve high-precision uniform etching to transfer microstructures on an arbitrary curved surface has become one of the key technical problems to be urgently solved in processing of a curved diffractive optical element.

SUMMARY

(1) Technical Problems to be Solved

For the above problems, the present disclosure provides a method for etching a curved substrate, for at least partially solving technical problems such as that it is difficult for the traditional processing methods to achieve uniform etching of diffraction microstructures of entire curved surface.

(2) Technical Solutions

A method for etching a curved substrate is provided in the present disclosure, including: forming a conductive thin film layer with an etched pattern on a curved substrate; supplying power to the conductive thin film layer such that the conductive thin film layer has an equal potential at each position of the conductive thin film layer; etching each position of the curved substrate to an etching depth corresponding to the potential at each position of the conductive thin film layer based on the etched pattern of the conductive thin film layer, so as to obtain the curved substrate having a consistent etching depth at each position of the curved substrate.

Further, the method further includes: placing the curved substrate in an etching device which includes at least an upper electrode and a lower electrode, where supplying power to the conductive thin film layer such that the conductive thin film layer has the equal potential at each position of the conductive thin film layer includes: connecting the conductive thin film layer with the lower electrode, such that the potential at each position of the conductive thin film layer is consistent with a potential at the lower electrode.

Further, the curved substrate is etched by supplying power to the upper electrode and the lower electrode of the etching device.

Further, the connecting the conductive thin film layer with the lower electrode includes: connecting a periphery of the conductive thin film with the lower electrode through a metal casing.

Further, two ends of the metal casing are fixed onto the periphery of the conductive thin film layer and the lower electrode through a conductive tape, respectively.

Further, the etching each position of the curved substrate to an etching depth corresponding to the potential at each position of the conductive thin film layer includes: performing reactive ion etching on the curved substrate, where an etching rate is consistent at each position of the curved substrate; and removing the conductive thin film layer after the etching is completed, so as to obtain a micro-nano structure of the curved substrate.

Further, the forming a conductive thin film layer with an etched pattern on a curved substrate includes: depositing the conductive thin film layer and preparing a photoresist layer on the curved substrate, sequentially; performing photolithography on the photoresist layer to form an etched pattern; etching the conductive thin film layer, so as to obtain the conductive thin film layer with the etched pattern; and removing the photoresist layer.

Further, the pattern is an internally connected pattern, including a mesh, a ring, or a scattering shape pattern.

Further, a surface shape of the curved substrate includes a concave surface, a convex surface, or an asymmetric complex curved surface.

Further, the conductive thin film layer includes a metal conductive thin film layer and a non-metal conductive thin film layer, where a material of the metal conductive thin film layer includes Cr, Ag, Au, Al, Cu, and Ni, and a material of the non-metal conductive thin film layer includes ITO and AZO.

According to another aspect of the present disclosure, a method for transferring a micro-nano structure pattern on a curved substrate with high precision by etching is provided, including: in step 1, depositing a conductive thin film with an appropriate thickness on a curved substrate; in step 2, preparing a layer of photoresist on the conductive thin film on the curved substrate, and forming a predetermined patterned microstructure of the photoresist on the conductive thin film on the curved substrate by using a direct writing method or a photolithography method; in step 3, etching, by using a wet etching method, to transfer the pattern of photoresist to the conductive thin film on the curved substrate by etching, so as to form a patterned microstructure of the conductive thin film which is consistent with the photoresist layer and serves as a metal mask for subsequent etching transfer; in step 4, placing the curved substrate on a sample stage of a reactive ion etching machine, and connecting the conductive thin film layer around the curved substrate with a lower electrode of the sample stage through a metal casing and a conductive tape; in step 5, adjusting appropriate etching process parameters of etching gas components, gas flow rate, and voltage, and performing reactive ion etching, so as to transfer the patterned structure of the conductive thin film to the curved substrate by etching; and in step 6, adjusting and controlling an etching depth precisely by controlling etching time, removing the residual photoresist layer by using acetone after a predetermined etching depth is reached, and removing the conductive thin film serving as the mask by using a metal etching solution, so as to complete a preparation of a micro-nano structure of the curved substrate.

Further, a material of the curved substrate in step 1 is a quartz or silicon material which is etchable by reactive ion etching (RIE), and a surface shape of the curved substrate is a concave surface, a convex surface, or an asymmetric complex curved surface.

Further, a method for the deposition in step 1 may be a method such as vacuum thermal evaporation or magnetron sputter deposition, and the appropriate thickness may be in a range of 5 nm to 500 nm.

Further, the conductive thin film in step 1 is a metal conductive thin film of Cr, Ag, Au, Al, Cu, or Ni, or a non-metal conductive thin film of ITO or AZO.

Further, a method for the preparation of the layer of photoresist in step 2 may be coating, spinning, spraying, or pulling, and the photoresist may be a photosensitive photoresist or an electron beam photoresist.

Further, the pattern of the photoresist serving as a mask in step 2 is designed as a radially connected microstructure such as a mesh, a ring, or a scattering shape pattern, so that an arbitrary point of the metal mask on an entire curved surface is in a well conductive state in step 3.

Further, the patterned micro-nano structure of the conductive thin film in step 3 serves as the lower electrode, such that the patterned micro-nano structure of the conductive thin film has a consistent potential at each area of the patterned micro-nano structure of the conductive thin film, and the curved substrate has a substantially consistent potential at each area on the curved substrate, so as to improve a uniformity of an electric field distribution.

Further, a material of the metal casing in step 4 is a good conductor metal of conductive aluminum or copper, the metal casing is in good electrical continuity with the curved substrate and the sample stage, and a distance between the metal casing and a periphery of a chamber body is greater than 10 mm such that the metal casing is spaced apart from the periphery of the chamber body.

Further, controlling the etching depth by controlling time in step 6 is mainly to select flat substrates of a same material and then measure an etching rate for the material of the substrates through a plurality of process tests; and when removing the conductive thin film layer, an etching solution is selected according to a material of the conductive thin film, and a selective removal is performed by wet etching.

(3) Beneficial Effects

In the method for etching the curved substrate provided by the present disclosure, by supplying power to the conductive thin film layer, the conductive thin film layer has the equal potential at each position of the conductive thin film layer, so as to form an equipotential body, thereby ensuring that the curved substrate has the consistent potential at the etched area on the curved substrate. The exposed area of the entire curved substrate is uniformly etched, and the area shielded by the metal conductive thin film is protected. The patterned conductive thin film in the present disclosure serves as both the mask and the electrode, thereby solving the problem of uneven etching and transferring of the micro-nano structure pattern on the curved substrate made of dielectric materials such as quartz, silicon, etc., and providing a possibility of preparing some functional structure devices having a complex arbitrary curved surface.

REFERENCE NUMERALS

1—step for depositing a conductive thin film; 2—step for spin-coating a photoresist;

3—step for exposure; 4—step for development;

5—step for removing a conductive thin film in an exposed area; 6—step for removing a photoresist;

7—step for etching a pattern in the exposed area; 8—step for removing all the remaining conductive thin film;

9—quartz; 10—step for first etching of photoresist;

11—step for third etching of substrate; 12—step for second etching of conductive thin film;

13—lower electrode; 14—copper foil;
15—conductive thin film; and 16—upper electrode.

DETAILED DESCRIPTION OF EMBODIMENTS

In order to make the objectives, technical solutions and advantages of the present disclosure clearer, the present disclosure will be further described in detail below with reference to the specific embodiments and the accompanying drawings.

The embodiments of the present disclosure provide a method for etching a curved substrate. By supplying power to a conductive thin film layer, each position of the curved substrate is etched to an etching depth corresponding to a potential at each position of the conductive thin film layer, so that a curved substrate having a consistent etching depth at each position of the curved substrate is obtained, thereby solving a problem of uneven etching transfer of a micro-nano structure pattern on a curved substrate of a dielectric material such as quartz, silicon or the like.

Figure 1:
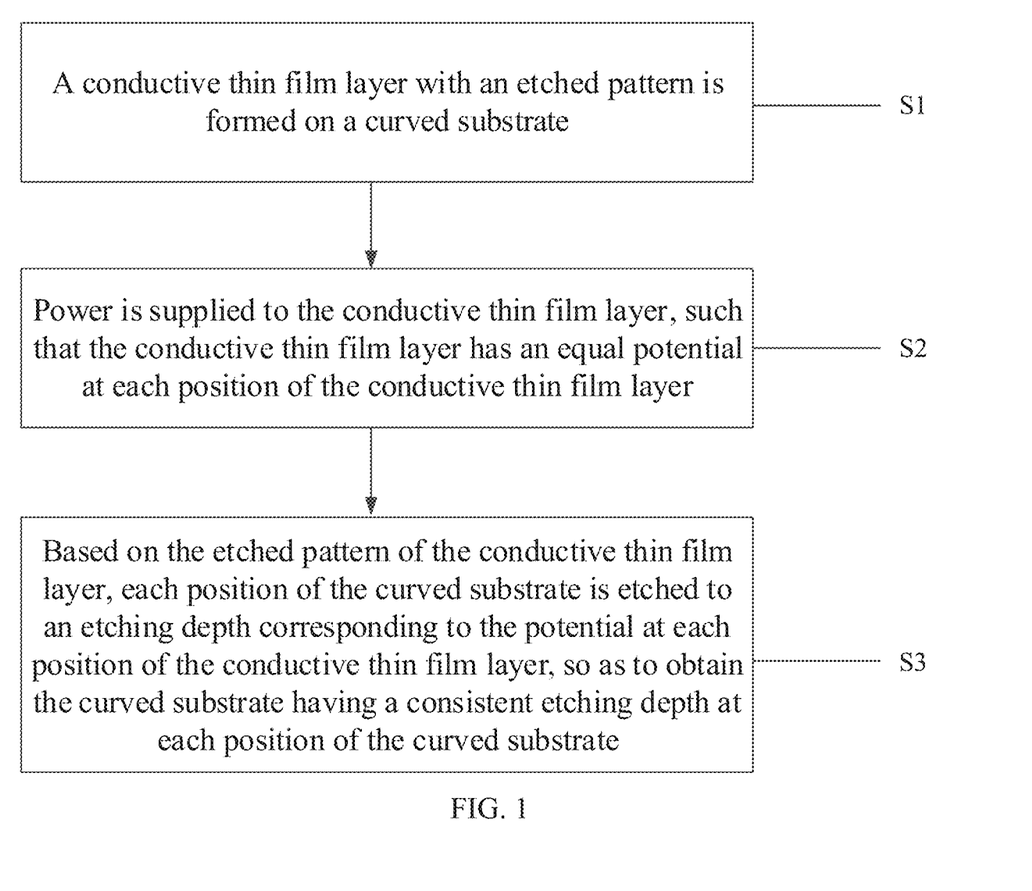
FIG. 1 schematically shows a schematic flowchart of a method for etching a curved substrate according to an embodiment of the present disclosure.

FIG. 1 schematically shows a flowchart of a method for etching a curved substrate according to an embodiment of the present disclosure.

In S1, a conductive thin film layer with an etched pattern is formed on a curved substrate.

In traditional RIE equipment, a sample stage for placing a sample is always in a form of a flat plate, so that it is difficult to transfer a microstructure pattern on a curved substrate by etching. The reason is that microstructures of a curved surface being at different heights from the flat electrode may lead to different electric field strengths, and this may further lead to different etching rates, so that it is difficult to achieve uniform etching for diffraction microstructures of the entire curved surface in nanometer level with high precision. The present disclosure takes the strength of the electric field as a starting point, in consideration of providing a uniform electric field to the curved substrate, it is firstly required to form a conductive thin film layer with an etched pattern on the substrate. The pattern is then transferred to the curved substrate.

In S2, power is supplied to the conductive thin film layer, such that the conductive thin film layer has an equal potential at each position of the conductive thin film layer.

The conductive thin film layer acts as an equipotential body after power is supplied, so that the curved substrate has a substantially consistent potential at each area of the curved substrate, thereby improving a uniformity of the electric field distribution.

In S3, based on the etched pattern of the conductive thin film layer, each position of the curved substrate is etched to an etching depth corresponding to the potential at each position of the conductive thin film layer, so as to obtain the curved substrate having a consistent etching depth at each position of the curved substrate.

On the one hand, the conductive thin film layer serves as a mask to transfer the etched pattern onto the curved substrate; on the other hand, the conductive thin film layer serves as an electrode to ensure potentials at etching areas of the curved substrate to be consistent, so that an entire exposed area of the curved substrate is uniformly etched, and an area shielded by the metal conductive thin film is protected.

On the basis of the above-mentioned embodiments, the method further includes: placing the curved substrate in an etching device which includes at least an upper electrode and a lower electrode; and supplying power to the conductive thin film layer such that the conductive thin film layer has the equal potential at each position of the conductive thin film layer, including: connecting the conductive thin film layer with the lower electrode, such that the potential at each position of the conductive thin film layer is consistent with a potential of the lower electrode.

The conductive thin film layer is connected with the lower electrode of a sample stage, so that the patterned micro-nano structure of the conductive thin film has a consistent potential at each area of the patterned micro-nano structure of the conductive thin film, and the curved substrate has a substantially consistent potential at each area of the curved substrate. Specifically, the etching device is a reactive ion etching system. Generally, an entire vacuum wall of the reactive ion etching machine is grounded as an anode. A cathode of the reactive ion etching machine serves as a power electrode, and a grounded shield on a side of the cathode may prevent the power electrode from being sputtered. A substrate to be corroded is placed on the power electrode. A corrosive gas fills the entire reaction chamber with a certain working pressure and a certain matching ratio. A high-frequency electric field with a voltage greater than a gas breakdown critical value is applied to the corrosive gas in the reaction chamber. Under an action of the strong electric field, stray electrons accelerated by the high-frequency electric field collide randomly with gas molecules or gas atoms. When the electron energy is increased to certain extent, the random collisions become inelastic collisions, resulting in secondary electron emission, and the electrons further collide with the gas molecules to continuously excite or ionize gas molecules. This violent collision causes ionization and recombination. When generation and vanishing of the electrons reach equilibrium, the discharge may be maintained continuously. Ions, electrons, and free radicals (free atoms, molecules, or atom groups) generated by the inelastic collisions are also known as plasmas, which has strong chemical activity and may react chemically with atoms of the surface of the sample to be etched to generate volatile substances, thereby realizing the corroding of the surface of the sample.

On the basis of the above embodiments, the curved substrate is etched by supplying power to the upper electrode and the lower electrode of the etching device.

Power is supplied to the upper electrode and the lower electrode of the etching device, and the corrosive gas molecules or atoms in the reaction chamber collide to form the plasmas, and the plasma reacts chemically with the atoms of the surface of the sample to be etched to generate the volatile substances, so as to etch the curved substrate.

On the basis of the above-mentioned embodiments, connecting the conductive thin film layer with the lower electrode includes connecting a periphery of the conductive thin film layer with the lower electrode through a metal casing.

A specific manner in which the conductive thin film layer is connected with the lower electrode includes: using the metal casing to connect with the periphery of the conductive thin film layer, with the metal casing further connected to the lower electrode of the etching device, so that the conductive thin film layer and the lower electrode together form an equipotential body, and then the reactive ion etching is performed. A material of the metal casing material is a good conductor metal, such as conductive aluminum or copper. The metal casing should be in good electrical continuity with the curved substrate and the sample stage. In addition, it is ensured that a distance between the metal casing and a periphery of a chamber body is greater than 10 mm, such that the metal casing is spaced apart from the periphery of the chamber body.

On the basis of the above-mentioned embodiments, the method further includes: fixing two ends of the metal casing onto the periphery of the conductive thin film layer and the lower electrode through a conductive tape, respectively.

The metal casing is connected with the periphery of the conductive thin film layer, where the metal casing is fixed with the conductive thin film layer through the conductive tape. The other end of the metal casing is also fixed to the lower electrode by the conductive tape, so as to ensure a stable potential during an etching process.

On the basis of the above embodiments, etching each position of the curved substrate to the etching depth corresponding to the potential at each position of the conductive thin film layer includes: performing reactive ion etching on the curved substrate, where an etching rate is consistent at each position of the curved substrate; removing the conductive thin film layer after the etching is completed, so as to obtain a micro-nano structure of the curved substrate.

Since the conductive thin film layer is connected with the lower electrode to form the equipotential body, the potential at each position of the curved substrate is the same, so that the etching rate is the same. After the etching is completed, the residual photoresist layer is removed by suing acetone, and the conductive thin film serving as the mask is removed by suing a metal etching solution, so as to obtain a uniformly etched micro-nano structure of the curved substrate. That is, the curved substrate has a consistent etching depth at each position of the curved substrate.

On the basis of the above embodiments, forming the conductive thin film layer having the etched pattern on the curved substrate includes: depositing the conductive thin film layer and preparing a photoresist layer on the curved substrate, sequentially; performing photolithography on the photoresist layer to form an etched pattern; etching the conductive thin film layer, so as to obtain the conductive thin film layer with the etched pattern; and removing the photoresist layer.

Vacuum thermal evaporation, magnetron sputtering deposition and other methods are used to prepare the conductive thin film on the surface of the curved substrate of quartz, silicon and other materials. Then a patterned conductive thin film that is consistent with the patterned microstructure is prepared by coating, photolithography, direct writing, wet etching or dry etching, and other processes.

It will be noted that the removal of the photoresist may also be performed after the reactive ion etching is performed on the curved substrate, that is, the removal of the residual photoresist layer may be performed in any process between a formation of the patterned microstructure of the conductive thin film and the removal of the conductive thin film layer. The sequence of the removal of the photoresist layer does not affect the final etching effect.

Preferably, a thickness of the conductive thin film layer is in a range of 5 nanometers to 500 nanometers. Within this thickness range, the conductive thin film layer may have a thickness meeting film forming conditions, thereby having good conductivity and etching resistance; and the thickness is not too thick, so that the patterned conductive thin film may be prepared and obtained by dry etching or wet etching.

Preferably, a method for preparing a layer of photoresist may be a method of coating, spinning, spraying, or pulling, and the photoresist may be a photosensitive photoresist or an electron beam photoresist.

Figure 2:
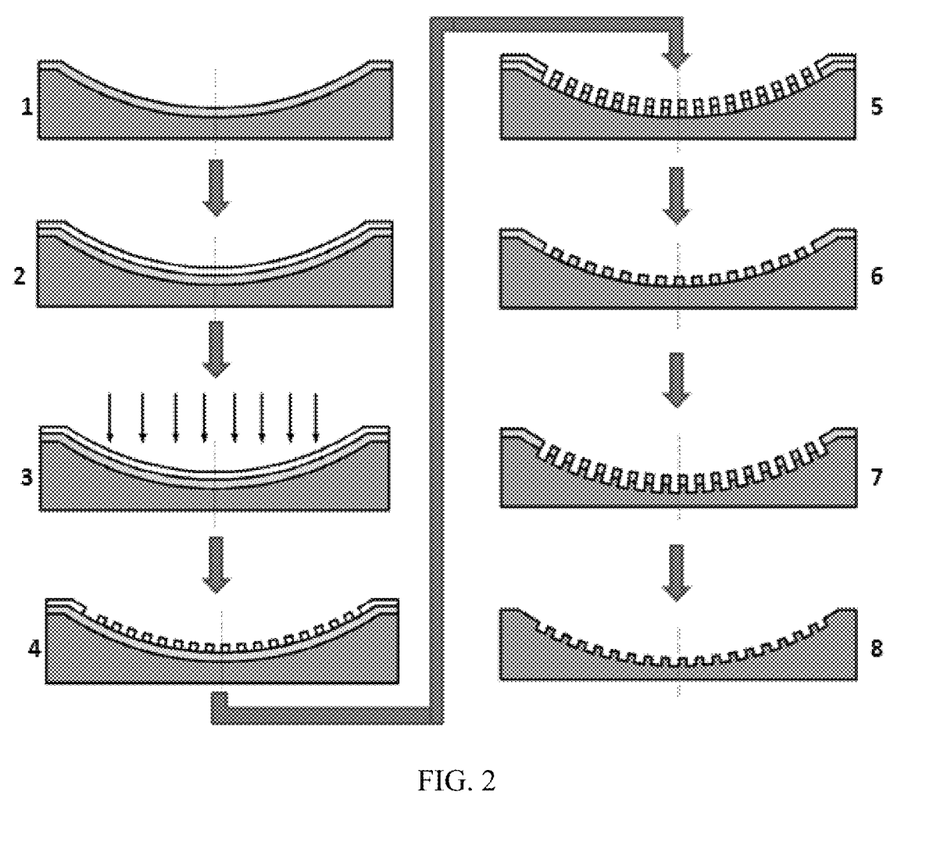
FIG. 2 schematically shows a complete flow chart of a method for etching a curved substrate according to an embodiment of the present disclosure.

FIG. 2 schematically shows a complete flowchart of a method for etching a curved substrate according to an embodiment of the present disclosure. The method includes the following steps 1 to 8.

In step 1, a conductive thin film with an appropriate thickness is deposited on a curved substrate.

In step 2, a layer of photoresist is prepared on the conductive thin film on the curved substrate.

In steps 3 and 4, a predetermined patterned microstructure of the photoresist is formed on the conductive thin film on the curved substrate by using a direct writing method or a photolithography method.

In step 5, the pattern of the photoresist is transferred to the conductive thin film on the curved substrate by etching, so as to form a patterned microstructure of the conductive thin film that is consistent with the photoresist layer and serves as a metal mask for subsequent etching transfer.

In step 6, the residual photoresist layer is removed by using acetone.

In this embodiment, the residual photoresist is removed after the patterned microstructure of the conductive thin film is formed by etching. In an actual application process, sequences of step 6 and step 7 may be interchanged. That is, the removal of the residual photoresist layer may be performed in any process between the formation of the conductive thin film and the removal of the conductive thin film. The sequence of photoresist removal does not affect the final etching effect.

In step 7, the curved substrate is placed on a sample stage of a reactive ion etching machine, the conductive thin film layer around the curved substrate is connected with the lower electrode of the sample stage by using a metal casing and a conductive tape.

Appropriate etching process parameters such as etching gas components, gas flow rate, bias voltage, cavity pressure, and etching time are adjusted, and reactive ion etching is performed, such that the patterned structure of the conductive thin film is transferred to the curved substrate by etching. An etching depth is adjusted and controlled precisely by controlling the etching time, until a predetermined etching depth is reached.

In step 8, after the predetermined etching depth is reached, the conductive thin film serving as the mask is removed by using a metal etching solution, so as to complete a preparation of a micro-nano structure of the curved substrate.

It will be noted that a depth obtained by reactive ion etching is related to the etching gas components, gas flow rate, bias voltage, etching time, and other conditions. The etching rate increases as the gas flow rate is increased. A higher $CHF_3$ ratio leads to a better etching steepness and a better etching uniformity. A higher $SF_6$ ratio leads to a faster etching rate. A larger bias voltage leads to a faster etching rate. However, if the bias voltage is too large, a temperature distribution of the etched sample will be uneven, which in turn reduces the etching uniformity. A lower cavity pressure may bring a better steepness but reduce the etching rate. The etching depth is proportional to the etching time.

Controlling the etching depth by controlling time is mainly to select flat substrates of a same material and then measure an etching rate for the substrate material through a plurality of process tests. When removing the conductive thin film layer, the etching solution should be selected according to a material of the conductive thin film, and a selective removal is performed by wet etching.

It is possible for the etching method to prepare a patterned micro-nano structure of a curved surface with good etching depth uniformity. The method is applicable for etching curved substrates having different surface shapes and different thicknesses, and it is also ensured good uniformity and replication of the etching.

On the basis of the above-mentioned embodiments, the pattern is an internally connected pattern, including a mesh, a ring, or a scattering shape pattern.

The pattern of the photoresist serving as a mask may be designed as a radially connected microstructure such as a mesh, a ring, or a scattering shape pattern, so that an arbitrary point of the metal mask on the entire curved surface is in a well conductive state during the etching process.

On the basis of the above embodiments, a surface shape of the curved substrate includes a concave surface, a convex surface, or an asymmetric complex curved surface.

The etching method may be applicable to different curved surfaces, including concave, convex, asymmetric complex curved surfaces, etc., and a curved substrate having a uniform etching depth may be obtained in each of these cases. The method may be widely used in preparation of diffractive optical elements such as a Fresnel lens, a diffraction grating, and a holographic grating.

On the basis of the above embodiments, the conductive thin film layer includes a metal conductive thin film layer and a non-metal conductive thin film layer, where a material of the metal conductive thin film layer is Cr, Ag, Au, Al, Cu, or Ni, and a material of the non-metallic conductive thin film layer is ITO or AZO.

The conductive thin film layer may be made of a common conductive material, including but not limited to the above metal conductive thin film and the non-metal conductive thin film, as long as the material has good conductivity.

The present disclosure will be described in detail below with two specific embodiments.

Embodiment 1

A method for transferring a micro-nano structure pattern on a quartz curved substrate with high precision by reactive ion etching is provided, and specific steps are as follows.

In step (1), magnetron sputtering is used to deposit a Cr thin film with a thickness of 100 nanometers on a concave quartz curved substrate. The conductive thin film 15 in step (1) is a Cr film.

In step (2), a layer of photoresist is prepared by a coating device on the quartz curved substrate which is coated with the Cr thin film, and a predetermined patterned microstructure of the photoresist is prepared on the Cr thin film on the curved substrate by photolithography, where the patterned microstructure has a pattern of a concentric ring array with radial connection lines.

In step (3), the pattern of the photoresist is transferred to the Cr conductive film on the curved substrate by wet etching by using a chromium removal solution, so as to form a patterned microstructure of the Cr thin film which is consistent with the photoresist layer and serves as a metal mask for subsequent etching transfer. This step is equivalent to the aforementioned step S1.

In step (4), the curved substrate is placed on the sample stage of the reactive ion etching machine, and the conductive Cr thin film layer around the curved substrate is connected with the lower electrode 13 of the sample stage through the metal casing and the conductive tape. This step is equivalent to the aforementioned step S2.

In step (5), appropriate etching gas components (where the gas components are $CHF_3$ and $SF_6$), gas flow rates (where a flow rate of $CHF_3$ is 80 sccm, and a flow rate of $SF_6$ is 10 sccm), bias voltage (about 420 V), cavity pressure of 0.3 Pa, and etching time (20 minutes) are adjusted, and the reactive ion etching is performed, so as to transfer the patterned structure of the conductive Cr thin film to the quartz curved substrate by etching. This step is equivalent to the aforementioned step S3.

In step (6), the etching depth is precisely adjusted and controlled by controlling the etching time. After the predetermined etching depth is reached, the residual photoresist layer is removed by using acetone, and the conductive Cr thin film serving as the mask is removed by using a chromium removal solution, so as to complete the preparation of the micro-nano structure of the curved substrate.

Figure 3:
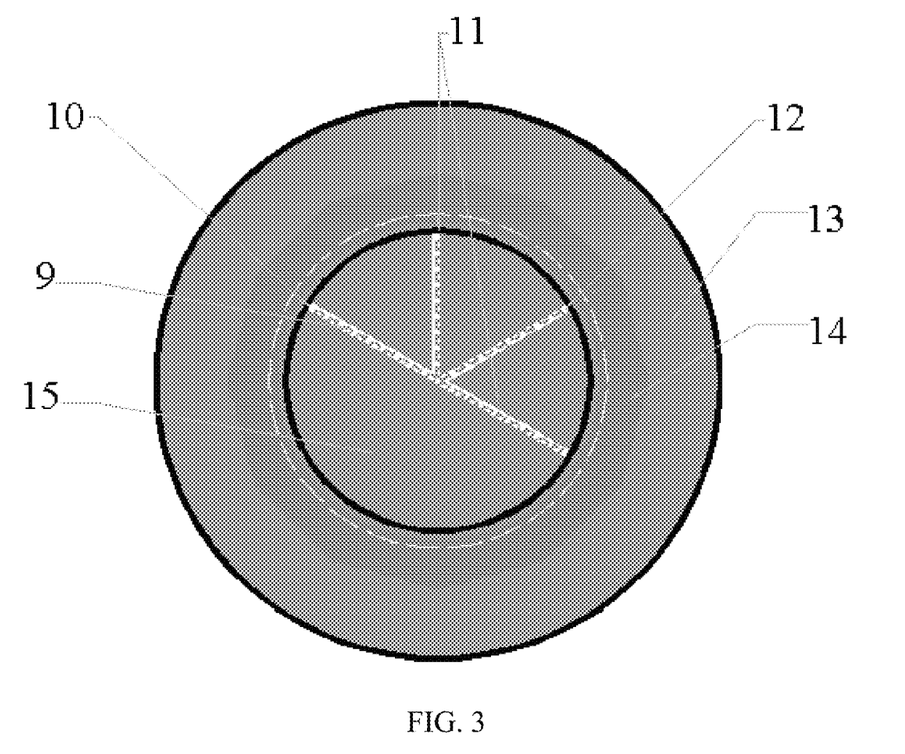
FIG. 3 schematically shows a top view of an etched substrate according to an embodiment of the present disclosure.
Figure 4:
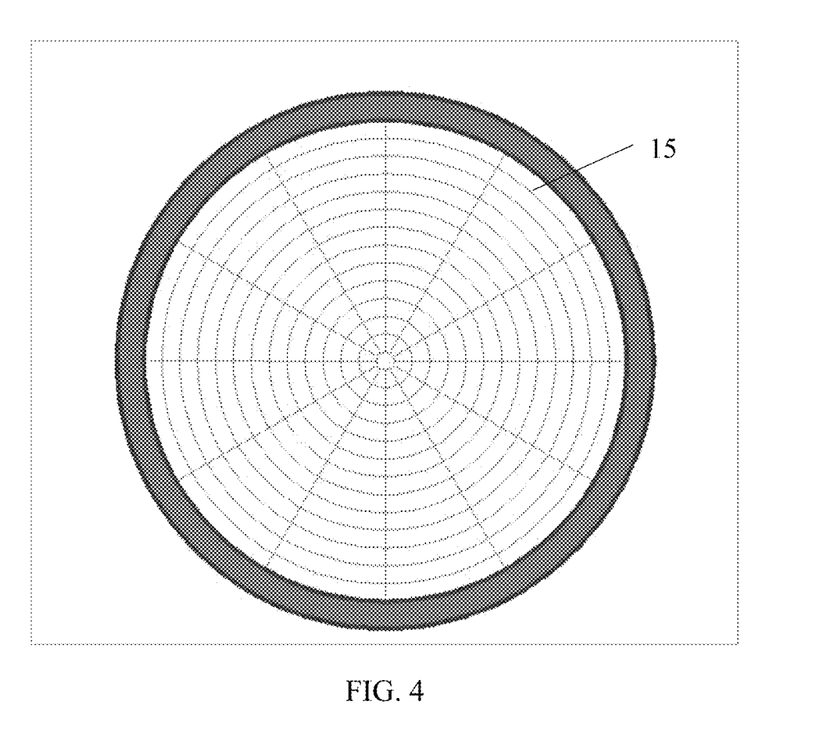
FIG. 4 schematically shows a schematic diagram of a pattern of a metal mask according to an embodiment of the present disclosure.
Figure 5:
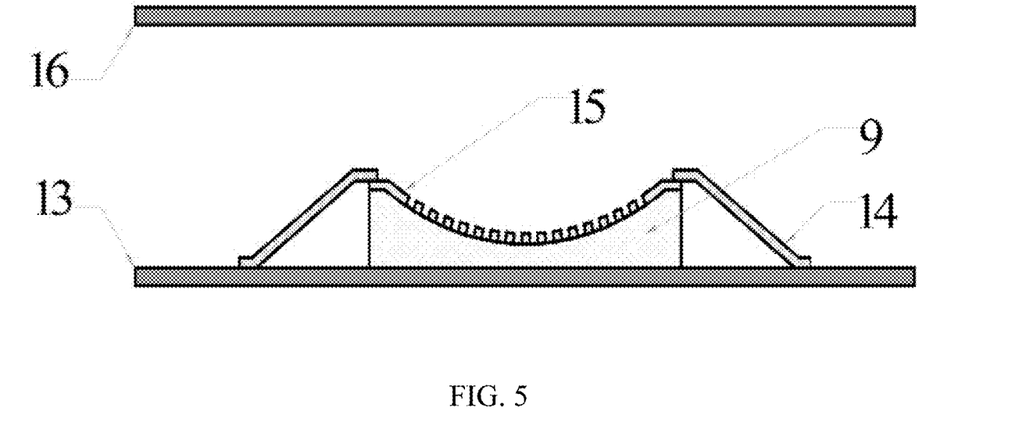
FIG. 5 schematically shows a sectional view of an etched substrate in an etching device according to an embodiment of the present disclosure.
Figure 6:
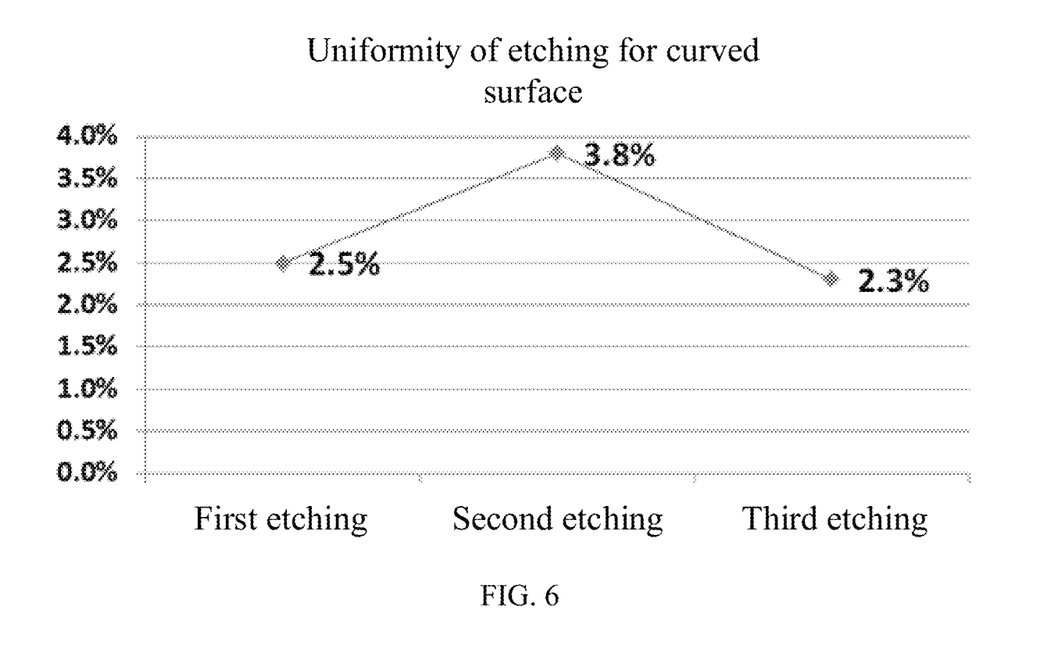
FIG. 6 schematically shows a diagram of uniformity through three etching processes according to an embodiment of the present disclosure.

FIG. 2 shows a processing flowchart according to this embodiment. FIG. 3 shows a top view of a placed etched substrate. FIG. 4 shows a diagram of a metal mask. FIG. 5 shows a sectional view of a placed etched substrate. FIG. 6 is a diagram showing uniformity of three etching processes, where etching substrates used in three etching experiments are all concave spherical quartz substrates with a same shape and a same size, where a radius of curvature is 200 mm and a sag height is 30 mm. The curved substrates are etched with the same etching parameters, and an etching depth and etching uniformity of each curved surface etching are measured by using a white light interferometer (the etching uniformity of each curved surface etching is defined as a maximum etching depth of the etching minus a minimum etching depth of the etching, then divided by an average etching depth).

Embodiment 2

A method for transferring a micro-nano structure pattern on a silicon curved substrate with high precision by reactive ion etching is provided, where electron beams are used to evaporate an Au film onto the convex silicon curved substrate, and specific steps are as follows.

In step (1), electron beams are used to deposit an Au film with a thickness of 5 nanometers on the convex silicon curved substrate.

In step (2), a layer of photoresist is prepared by a coating device on the silicon curved substrate which is coated with the Au thin film, and a predetermined patterned microstructure of the photoresist is prepared on the conductive Au thin film on the convex silicon curved substrate by laser direct writing, where the pattern is, for example, a mesh structure with a period of 50 microns.

In step (3), the pattern of the photoresist is transferred to the Au conductive thin film on the silicon curved substrate by using the method of ion beam etching, so as to form a patterned microstructure of the conductive Au thin film which is consistent with the photoresist layer and serves as a metal mask for subsequent etching transfer. Then the residual photoresist layer may be removed by using acetone. This step is equivalent to the aforementioned step S1.

In step (4), the silicon curved substrate is placed on the sample stage of the reactive ion etching machine, and the conductive Au thin film layer around the curved substrate is connected with the lower electrode 13 of the sample stage through the metal casing and the conductive tape. This is equivalent to the aforementioned step S2.

In step (5), appropriate etching gas components (where the gas components are $CHF_3$ and $SF_6$), gas flow rates (where a flow rate of $CHF_3$ is 20 sccm, and a flow rate of $SF_6$ is 50 sccm), bias voltage (about 200 V), cavity pressure of 0.5 Pa, and etching time (4 minutes) are adjusted, and the reactive ion etching is performed, so as to transfer the patterned structure of the conductive Au thin film to the silicon curved substrate by etching. This is equivalent to the aforementioned step S3.

In step (6), the etching depth is precisely adjusted and controlled by controlling the etching time. After a predetermined etching depth is reached, the residual photoresist layer is removed by using acetone, and the conductive Au thin film serving as the mask is removed by using an aurum removal solution, so as to complete the preparation of the micro-nano structure of the curved substrate.

A principle of the present disclosure is as follows: in the method for transferring the patterned micro-nano structure onto the curved substrate with high precision by etching, a conductive thin film with an appropriate thickness is deposited on the curved substrate first; a layer of photoresist is prepared on the conductive thin film on the curved substrate by direct writing or photolithography, and the predetermined patterned micro-nano structure of the photoresist is formed on the conductive thin film on the curved substrate; the pattern of photoresist is transferred to the conductive thin film on the curved substrate by wet etching, so as to form the patterned micro-nano structure of the conductive thin film which is consistent with the photoresist layer and serves as a metal mask for the subsequent etching transfer; and finally, the curved substrate is placed on the sample stage of the reactive ion etching machine, and the conductive thin film layer around the curved substrate is connected with the lower electrode of the sample stage through the metal casing and the conductive tape. With appropriate etching gas components, gas flow rate, bias voltage, chamber pressure, etching time, and other etching process parameters adjusted, the reactive ion etching is performed, so as to transfer the patterned structure of the conductive thin film onto the curved substrate by etching, then the residual photoresist layer is removed by using acetone, and the thin conductive thin film serving as the mask is removed by using the metal etching solution, so as to complete the preparation of the micro-nano structure of the curved substrate.

Compared with the prior art, the present disclosure has the following advantages.

(1) In the present disclosure, methods such as vacuum thermal evaporation, magnetron sputtering deposition, etc. are used to prepare a layer of conductive thin film on the surface of a curved substrate made of a material such as quartz and silicon; a patterned conductive thin film consistent with a patterned microstructure is prepared through processes of coating, photolithography, direct writing, wet or dry etching, and the like; the conductive film layer around the curved substrate is connected with the lower electrode of the sample stage through a metal casing and a conductive tape, so as to ensure a good conductive contact and form an equipotential body; and then reactive ion etching is performed. The method may ensure that the curved substrate has consistent potentials at etched areas of the curved substrate, so that an exposed area of the entire curved substrate is uniformly etched, and an area shielded by the metal conductive thin film is protected. The patterned metal thin film in the present disclosure serves as both the mask and the electrode, thereby solving the problem of uneven etching and transfer of the patterned micro-nano structure on the curved substrate made of a dielectric material such as quartz and silicon, and providing a possibility of preparing some functional structure devices with complex arbitrary curved surface.

(2) In the present disclosure, the pattern of photoresist is transferred to the conductive thin film on the curved substrate by etching, so as to form the patterned microstructure of the conductive thin film which is consistent with the photoresist layer, and the patterned microstructure of conductive thin film serves as the metal mask for the subsequent etching transfer. The conductive thin film deposited on the curved substrate may be a metal conductive thin film selected from Cr, Ag, Au, Al, Cu, and Ni, or may be a non-metal conductive thin film of ITO or AZO. The transfer of the pattern of the mask is achieved by placing the curved substrate on the sample stage of the reactive ion etching machine, and connecting the conductive thin film layer around the curved substrate with the lower electrode of the sample stage through the metal casing and the conductive tape. A material of the metal casing is a good conductor metal such as conductive aluminum and copper. The metal casing should be in good electrical continuity with the curved substrate and the sample stage, and a distance from the metal casing to a periphery of a chamber body is ensured to be greater than 10 mm such that the metal casing is spaced apart from the periphery of the chamber body. Therefore, microstructures on an arbitrary curved surface may be transferred with high precision by uniform etching.

(3) The pattern of the photoresist mask in the present disclosure is designed as a radially connected microstructure such as a mesh, a ring, or a scattering shape pattern, so as to ensure that the metal mask formed by wet etching is in a good conductive state at any point on the entire curved surface, so that the patterned micro-nano structure on the curved surface may be transferred to the substrate by uniform etching during the preparation process.

(4) The thickness of the conductive thin film deposited in the present disclosure is controlled to be in a range of 5 nanometers to 500 nanometers; the metal mask which is prepared by performing photolithography or direct writing on the deposited thin film may better transfer patterned the micro-nano structure to a concave, convex, or asymmetric complex surface; and it is ensured that a processing accuracy of the depth of the micro-nano structure is controlled within tens of nanometers with good uniformity.

The specific embodiments described above further describe the objectives, technical solutions and beneficial effects of the present disclosure in detail. It will be understood that the above-mentioned specific embodiments are only specific embodiments of the present disclosure, and are not intended to limit the present disclosure. Any modification, equivalent replacement, improvement, etc., made within the spirit and principle of the present disclosure should be included within the protection scope of the present disclosure.

What is claimed is:

1. A method for etching a curved substrate, comprising:
   forming a conductive thin film layer with an etched pattern on a curved substrate;
   supplying power to the conductive thin film layer such that the conductive thin film layer has an equal potential at each position of the conductive thin film layer;
   etching each position of the curved substrate to an etching depth corresponding to the potential at each position of the conductive thin film layer based on the etched pattern of the conductive thin film layer, so as to obtain the curved substrate having a consistent etching depth at each position of the curved substrate.

2. The method for etching a curved substrate according to claim 1, further comprising:
   placing the curved substrate in an etching device which comprises at least an upper electrode and a lower electrode,
   wherein supplying power to the conductive thin film layer such that the conductive thin film layer has the equal potential at each position of the conductive thin film layer comprises:

connecting the conductive thin film layer with the lower electrode, such that the potential at each position of the conductive thin film layer is consistent with a potential at the lower electrode.

3. The method for etching a curved substrate according to claim 2, wherein the curved substrate is etched by supplying power to the upper electrode and the lower electrode of the etching device.

4. The method for etching a curved substrate according to claim 2, wherein the connecting the conductive thin film layer with the lower electrode comprises:
connecting a periphery of the conductive thin film with the lower electrode through a metal casing.

5. The method for etching a curved substrate according to claim 4, further comprising:
fixing two ends of the metal casing onto the periphery of the conductive thin film layer and the lower electrode through a conductive tape, respectively.

6. The method for etching a curved substrate according to claim 1, wherein the etching each position of the curved substrate to an etching depth corresponding to the potential at each position of the conductive thin film layer comprises:
performing reactive ion etching on the curved substrate, wherein an etching rate is consistent at each position of the curved substrate; and
removing the conductive thin film layer after the etching is completed, so as to obtain a micro-nano structure of the curved substrate.

7. The method for etching a curved substrate according to claim 1, wherein the forming a conductive thin film layer with an etched pattern on a curved substrate comprises:
depositing the conductive thin film layer and preparing a photoresist layer on the curved substrate, sequentially;
performing photolithography on the photoresist layer to form an etched pattern;
etching the conductive thin film layer, so as to obtain the conductive thin film layer with the etched pattern; and
removing the photoresist layer.

8. The method for etching a curved substrate according to claim 7, wherein the pattern is an internally connected pattern, comprising a mesh, a ring, or a scattering shape pattern.

9. The method for etching a curved substrate according to claim 1, wherein a surface shape of the curved substrate comprises a concave surface, a convex surface, or an asymmetric complex curved surface.

10. The method for etching a curved substrate according to claim 1, wherein the conductive thin film layer comprises a metal conductive thin film layer and a non-metal conductive thin film layer, wherein a material of the metal conductive thin film layer comprises Cr, Ag, Au, Al, Cu, and Ni, and a material of the non-metal conductive thin film layer comprises ITO and AZO.

11. A method for transferring a micro-nano structure pattern on a curved substrate with high precision by etching, comprising:
in step 1, depositing a conductive thin film with an appropriate thickness on a curved substrate;
in step 2, preparing a layer of photoresist on the conductive thin film on the curved substrate, and forming a predetermined patterned microstructure of the photoresist on the conductive thin film on the curved substrate by using a direct writing method or a photolithography method;
in step 3, etching, by using a wet etching method, to transfer the pattern of the photoresist to the conductive thin film on the curved substrate by etching, so as to form a patterned microstructure of the conductive thin film which is consistent with the photoresist layer and serves as a metal mask for subsequent etching transfer;
in step 4, placing the curved substrate on a sample stage of a reactive ion etching machine, and connecting the conductive thin film layer around the curved substrate with a lower electrode of the sample stage through a metal casing and a conductive tape;
in step 5, adjusting appropriate etching process parameters of etching gas components, gas flow rate, and voltage, and performing reactive ion etching, so as to transfer the patterned structure of the conductive thin film to the curved substrate by etching; and
in step 6, adjusting and controlling an etching depth precisely by controlling etching time, removing the residual photoresist layer by using acetone after a predetermined etching depth is reached, and removing the conductive thin film serving as the mask by using a metal etching solution, so as to complete a preparation of a micro-nano structure of the curved substrate.

12. The method for transferring a micro-nano structure pattern on a curved substrate with high precision by etching according to claim 11, wherein a material of the curved substrate in step 1 is a quartz or silicon material which is etchable by reactive ion etching (RIE), and a surface shape of the curved substrate is a concave surface, a convex surface, or an asymmetric complex curved surface.

13. The method for transferring a micro-nano structure pattern on a curved substrate with high precision by etching according to claim 11, wherein a method for the deposition in step 1 may be a method such as vacuum thermal evaporation or magnetron sputter deposition, and the appropriate thickness may be in a range of 5 nm to 500 nm.

14. The method for transferring a micro-nano structure pattern on a curved substrate with high precision by etching according to claim 11, wherein the conductive thin film in step 1 is a metal conductive thin film of Cr, Ag, Au, Al, Cu, or Ni, or a non-metal conductive thin film of ITO or AZO.

15. The method for transferring a micro-nano structure pattern on a curved substrate with high precision by etching according to claim 11, wherein a method for the preparation of the layer of photoresist in step 2 may be coating, spinning, spraying, or pulling, and the photoresist may be a photosensitive photoresist or an electron beam photoresist.

16. The method for transferring a micro-nano structure pattern on a curved substrate with high precision by etching according to claim 11, wherein the pattern of the photoresist serving as a mask in step 2 is designed as a radially connected microstructure such as a mesh, a ring, or a scattering shape pattern, so that an arbitrary point of the metal mask on an entire curved surface is in a well conductive state in step 3.

17. The method for transferring a micro-nano structure pattern on a curved substrate with high precision by etching according to claim 11, wherein the patterned micro-nano structure of the conductive thin film in step 3 serves as the lower electrode, such that the patterned micro-nano structure of the conductive thin film has a consistent potential at each area of the patterned micro-nano structure of the conductive thin film, and the curved substrate has a substantially consistent potential at each area on the curved substrate, so as to improve a uniformity of an electric field distribution.

18. The method for transferring a micro-nano structure pattern on a curved substrate with high precision by etching according to claim 11, wherein a material of the metal casing in step 4 is a good conductor metal of conductive aluminum or copper, the metal casing is in good electrical continuity with the curved substrate and the sample stage, and a distance between the metal casing and a periphery of a chamber body is greater than 10 mm such that the metal casing is spaced apart from the periphery of the chamber body.

19. The method for transferring a micro-nano structure pattern on a curved substrate with high precision by etching according to claim 11, wherein controlling the etching depth by controlling time in step 6 is mainly to select flat substrates of a same material and then measure an etching rate for the material of the substrates through a plurality of process tests; and when removing the conductive thin film layer, an etching solution is selected according to a material of the conductive thin film, and a selective removal is performed by wet etching.

* * * * *